(12) United States Patent
Bard et al.

(10) Patent No.: US 7,646,603 B2
(45) Date of Patent: Jan. 12, 2010

(54) NOISE-REDUCING ATTACHMENT APPARATUS FOR HEAT EXCHANGER DOOR OF AN ELECTRONICS RACK OF A DATA CENTER

(75) Inventors: Seth E. Bard, Poughkeepsie, NY (US); Robert N. Boyes, Jr., Poughkeepsie, NY (US); Gerard F. Muenkel, Raleigh, NC (US); Matthew A. Nobile, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/030,484

(22) Filed: Feb. 13, 2008

(65) Prior Publication Data

US 2009/0201640 A1 Aug. 13, 2009

(51) Int. Cl.
*H05K 7/20* (2006.01)
*F28D 15/00* (2006.01)
*G10K 11/04* (2006.01)

(52) U.S. Cl. ............. 361/696; 361/679.47; 361/679.49; 361/679.53; 361/690; 361/692; 361/694; 361/695; 361/701; 165/104.33; 312/236; 454/184; 181/200; 181/224

(58) Field of Classification Search . 361/679.46–679.5, 361/679.53, 690, 692, 694–696, 698, 699, 361/701; 165/80.3–80.4, 104.33, 121, 165; 174/15.1, 16.1; 312/223.2, 236; 454/184; 181/200–201, 224

See application file for complete search history.

(56) References Cited

U.S. PATENT DOCUMENTS 5,526,228 A    6/1996  Dickson et al.
6,104,608 A *  8/2000  Casinelli et al. ............. 361/692
6,198,627 B1 * 3/2001  Roehling et al. ............ 361/688
6,296,333 B1 * 10/2001 Lee et al. .................. 312/223.2
6,373,697 B1 * 4/2002  Lajara et al. ........... 361/679.48

(Continued)

OTHER PUBLICATIONS

Campbell et al., "Cooled Electronics System and Method Employing Air-to-Liquid Heat Exchange and Bifurcated Air Flow", U.S. Appl. No. 11/462,245, filed Aug. 25, 2006.

(Continued)

*Primary Examiner*—Jayprakash N Gandhi
*Assistant Examiner*—Robert J Hoffberg
(74) *Attorney, Agent, or Firm*—Geraldine Monteleone, Esq.; Kevin P. Radigan, Esq.; Heslin Rothenberg Farley & Mesiti, P.C.

(57) ABSTRACT

A noise-reducing attachment apparatus for a heat exchanger door is provided for facilitating attenuation of noise emanating from an electronics rack. The apparatus includes a frame structure configured to coupled to the heat exchanger door. The door includes in air opening and air-to-liquid heat exchanger, and air passing through the air opening also passes across the heat exchanger. The air opening facilitates passage of external air through the electronics rack. The frame structure defines in part an airflow channel through the apparatus, wherein air passing through the air opening also passes through the airflow channel when the apparatus is operatively coupled to the door. An acoustically absorptive material, which is coupled to the frame structure and at least partially defines the airflow opening through the apparatus, is selected and positioned to attenuate noise emanating from the electronics rack when the apparatus is coupled to the heat exchanger door.

20 Claims, 13 Drawing Sheets

U.S. PATENT DOCUMENTS

| | | | |
|---|---|---|---|
| 6,481,527 B1 * | 11/2002 | French et al. | 181/201 |
| 6,542,362 B2 * | 4/2003 | Lajara et al. | 361/679.48 |
| 6,745,149 B2 | 6/2004 | Beeten | |
| 6,816,372 B2 * | 11/2004 | Huettner et al. | 361/695 |
| 7,283,358 B2 * | 10/2007 | Campbell et al. | 361/694 |
| 7,283,359 B2 * | 10/2007 | Bartell et al. | 361/695 |
| 7,286,348 B2 * | 10/2007 | Vinson et al. | 361/695 |
| 7,334,662 B1 * | 2/2008 | Anderl et al. | 181/200 |
| 7,379,298 B2 * | 5/2008 | Walsh et al. | 361/692 |
| 7,379,299 B2 * | 5/2008 | Walsh et al. | 361/695 |
| 7,385,810 B2 * | 6/2008 | Chu et al. | 361/679.48 |
| 7,400,501 B2 * | 7/2008 | Bartell et al. | 361/695 |
| 2006/0232945 A1 | 10/2006 | Chu et al. | |
| 2007/0139882 A1 | 6/2007 | Bartell et al. | |
| 2007/0151707 A1 * | 7/2007 | Lyons et al. | 165/104.21 |
| 2007/0230114 A1 | 10/2007 | Bartell et al. | |
| 2007/0230124 A1 * | 10/2007 | Bartell et al. | 361/695 |
| 2007/0274036 A1 | 11/2007 | Walsh et al. | |
| 2008/0007911 A1 * | 1/2008 | Hallin et al. | 361/687 |
| 2008/0106864 A1 * | 5/2008 | Merino | 361/688 |
| 2009/0080173 A1 * | 3/2009 | Porter et al. | 361/831 |

OTHER PUBLICATIONS

Porter et al., "Vapor-Compression Heat Exchange System with Evaporator Coil Mounted to Outlet Door Cover of an Electronics Rack", U.S. Appl. No. 11/860,634, filed Sep. 25, 2007.

Nobile, Matthew, "Acoustically Absorptive Anti-Recirculation Panel for One or More Electronics Racks of a Data Center", U.S. Appl. No. 11/942,775, filed Nov. 20, 2007.

Hoeft et al., "Inter-Rack Airflow Arresting Apparatus and Method for Facilitating Cooling of an Electronics Rack of a Data Center", U.S. Appl. No. 11/942,815, filed Nov. 20, 2007.

\* cited by examiner

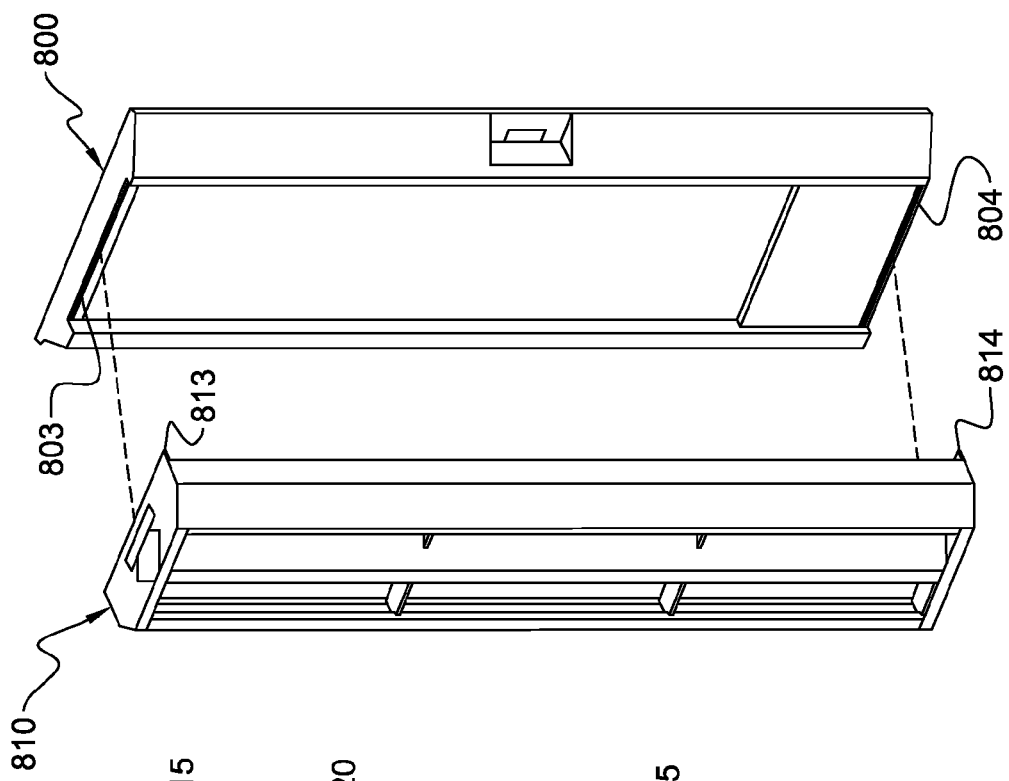
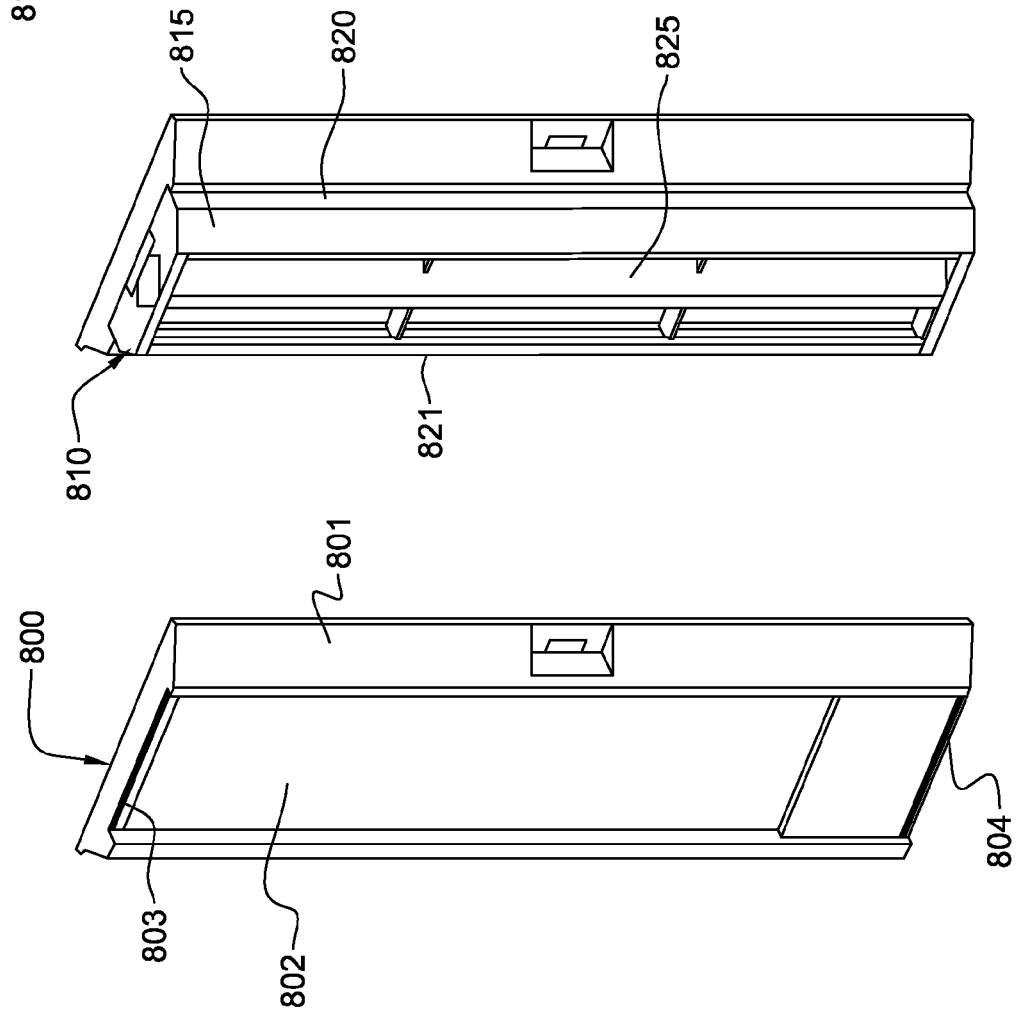
FIG. 8C
FIG. 8B
FIG. 8A

NOISE-REDUCING ATTACHMENT APPARATUS FOR HEAT EXCHANGER DOOR OF AN ELECTRONICS RACK OF A DATA CENTER

TECHNICAL FIELD

The present invention relates in general to apparatuses and methods for facilitating cooling of rack-mounted assemblages of individual electronics units, such as rack-mounted computer server units, and more particularly, to a noise-reducing attachment apparatus configured to mount to a heat exchanger door of an electronics rack and facilitate noise reduction within a data center containing the electronics rack.

BACKGROUND OF THE INVENTION

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., a data center).

The sensible heat load carried by the air exiting the rack is stressing the ability of the room air-conditioning to effectively handle the load. This is especially true for large installations with "server farms" or large banks of electronics racks close together. In such installations not only will the room air-conditioning be challenged, but the situation may also result in recirculation problems with some fraction of the "hot" air exiting one rack unit being drawn into the air inlet of the same rack or a nearby rack. This recirculating flow is often extremely complex in nature, and can lead to significantly higher rack inlet temperatures than expected. This increase in cooling air temperature may result in components exceeding their allowable operating temperature and in a reduction in long term reliability of the components.

In addition, with the large number of electronics racks in many data center installations, the acoustical noise generated by both the fans in the electronics racks circulating air through the racks, and the fans of the computer room air conditioning units required to cool the data center are rising to unacceptably high levels.

SUMMARY OF THE INVENTION

The shortcomings of the prior art are overcome and additional advantages are provided herein through the provision of a noise-reducing attachment apparatus which includes a frame structure and an acoustically absorptive material. The frame structure is configured to couple to an exterior of a heat exchanger door hingedly mounted to an electronics rack. The heat exchanger door includes an air opening and an air-to-liquid heat exchanger. The air opening in the heat exchanger door facilitates the ingress or egress of external air through the electronics rack, and air passing across the air opening also passes across the air-to-liquid heat exchanger. The frame structure of the noise-reducing attachment apparatus defines in part at least one airflow channel through the noise-reducing attachment apparatus, wherein when the noise-reducing attachment apparatus is operatively coupled to the heat exchanger door, air passing through the air opening of the heat exchanger door also passes through the at least one airflow channel of the noise-reducing attachment apparatus. The acoustically absorptive material is coupled to the frame structure and at least partially defines the at least one airflow channel through the noise-reducing attachment apparatus. The acoustically absorptive material is selected and positioned to attenuate noise emanating from the electronics rack when the noise-reducing attachment apparatus is operatively coupled to the heat exchanger door.

In another aspect, a heat exchanger door assembly for an electronics rack is provided. The heat exchanger door assembly includes a heat exchanger door and a noise-reducing attachment apparatus coupled to the heat exchanger door. The heat exchanger door includes a door frame and an air-to-liquid heat exchanger supported by the door frame. The door frame is configured to hingedly mount to an electronics rack at one of the air inlet side or outlet side thereof, with the air inlet and air outlet sides respectively enabling ingress and egress of external air through the electronics rack. The door frame includes an air opening which facilitates the ingress or egress of external air through the electronics rack, and wherein air passing through the electronics rack from the air inlet side to the air outlet side thereof passes across the air-to-liquid heat exchanger when the heat exchanger door is operatively, hingedly mounted to the electronics rack and through the air opening in the door frame. The noise-reducing attachment apparatus includes a frame structure coupled to an exterior surface of the heat exchanger door. The frame structure defines in part at least one airflow channel through the noise-reducing attachment apparatus, wherein air passing through the air opening in the heat exchanger door passes through at least one airflow channel in the frame structure. An acoustically absorptive material is coupled to the frame structure and at least partially defines the at least one airflow channel through the noise-reducing attachment apparatus. The acoustically absorptive material is selected and positioned to attenuate noise emanating from the electronics rack when the heat exchanger door assembly is operatively mounted thereto.

In a further aspect, a cooled electronics system is provided. The cooled electronics system includes an electronics rack, a heat exchanger door coupled to the electronics rack, and to a noise-reducing attachment apparatus coupled to the heat exchanger door. The electronics rack includes an air inlet side and an air outlet side, wherein the air inlet and air outlet sides respectively enable ingress and egress of external air through the electronics rack. Additionally, at least one air moving device is provided within the electronics rack. The at least one air moving device is capable of causing external air to flow from the air inlet side of the electronics rack to the air outlet side thereof. The heat exchanger door includes a door frame, configured to mount the electronics rack at one of the air inlet side or air outlet side thereof, and an air-to-liquid heat exchanger supported by the door frame. The door frame also includes an air opening which facilitates the ingress or egress of external air through the electronics rack, and the heat exchanger is disposed so that air passing through the electronics rack from the air inlet side to the air outlet side thereof passes across the air-to-liquid heat exchanger. The noise-reducing attachment apparatus includes a frame structure coupled to the exterior of the heat exchanger door. The frame structure defines in part at least one airflow channel through the noise-reducing attachment apparatus, wherein air passing through the air opening in the heat exchanger door also passes through the at least one airflow channel of the frame structure. An acoustically absorptive material is coupled to the frame structure and at least partially defines the at least one airflow channel through the noise-reducing attachment apparatus. The acoustically absorptive material is selected and positioned to attenuate noise emanating from the electronics rack.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 8A is an isometric view of a heat exchanger door, such as the heat exchanger door of FIGS. 5-7B, in accordance with an aspect of the present invention;

FIG. 8B is an isometric view of a heat exchanger door assembly comprising the heat exchanger door of FIG. 8A, and one embodiment of a noise-reducing attachment apparatus operatively coupled thereto, in accordance with an aspect of the present invention;

FIG. 8C is an exploded view of the heat exchanger door and noise-reducing attachment apparatus of FIG. 8B, in accordance with an aspect of the present invention;

DETAILED DESCRIPTION OF THE INVENTION

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the electronics drawers of a multi-drawer rack unit and blades of a blade center system being two examples of subsystems of an electronics rack to be cooled. Further, "data center" refers to a computer installation containing one or more electronics racks to be cooled. As a specific example, a data center may include one or more rows of rack-mounted computing units, such as server units.

As used herein, "air-to-liquid heat exchanger" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal communication with a plurality of air-cooled cooling fins. Size, configuration and construction of the air-to-liquid heat exchanger can vary without departing from the scope of the invention disclosed herein.

As used herein, air flows "across" the heat exchanger and "coolant" flows "through" the heat exchanger. Flowing across the heat exchanger refers to air passing across the outside of the conductive tubing forming the one or more coolant flow paths, while flowing through the heat exchanger refers to the coolant (e.g., liquid) passing through the heat exchanger's one or more coolant flow paths formed by the conductive tubing.

One example of liquid coolant employed in an air-to-liquid heat exchanger is water. However, the concepts disclosed herein are readily adapted to use with other types of liquid coolant. For example, one or more of the liquid coolants may comprise a brine, a fluorocarbon liquid, a liquid metal, or other similar coolant, or refrigerant, while still maintaining the advantages and unique features of the present invention.

Reference is made below to the drawings, which are not drawn to scale to facilitate understanding, wherein the same reference numbers used throughout different figures designate the same or similar components.

Figure 1:
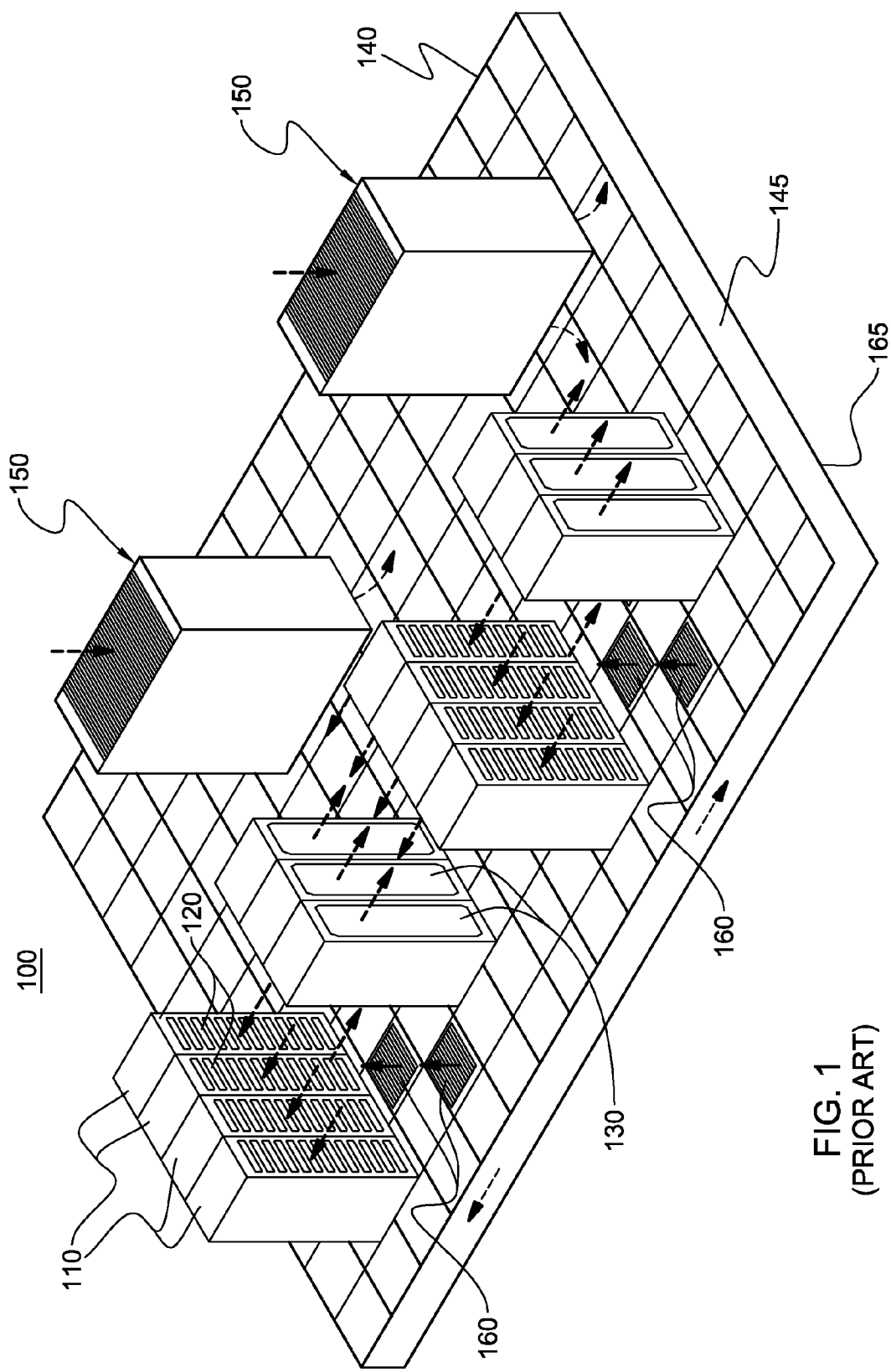
FIG. 1 depicts one embodiment of a conventional raised floor layout of an air cooled computer installation.

As shown in FIG. 1, in a raised floor layout of an air cooled computer installation 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at the air inlet sides 120 of the electronics racks and expelled through the air outlet sides 130 of the electronics racks. Each electronics rack 110 may have an air moving device (e.g., fan or blower) to provide forced inlet-to-outlet airflow to cool the electronic components within the drawer(s) of the rack. The supply air plenum 145 provides filtered and cooled air to the air-inlet sides of the electronics racks via perforated floor tiles 160 disposed in a "cold" aisle of the computer installation. The filtered and cooled air is supplied to plenum 145 by one or more air conditioning units 150, also disposed within the computer installation 100. Room air is taken into each air conditioning unit 150 near an upper portion thereof. This room air comprises in part exhausted air from the "hot" aisles of the computer installation defined, for example, by opposing air outlet sides 130 of electronics racks 110.

Figure 2:
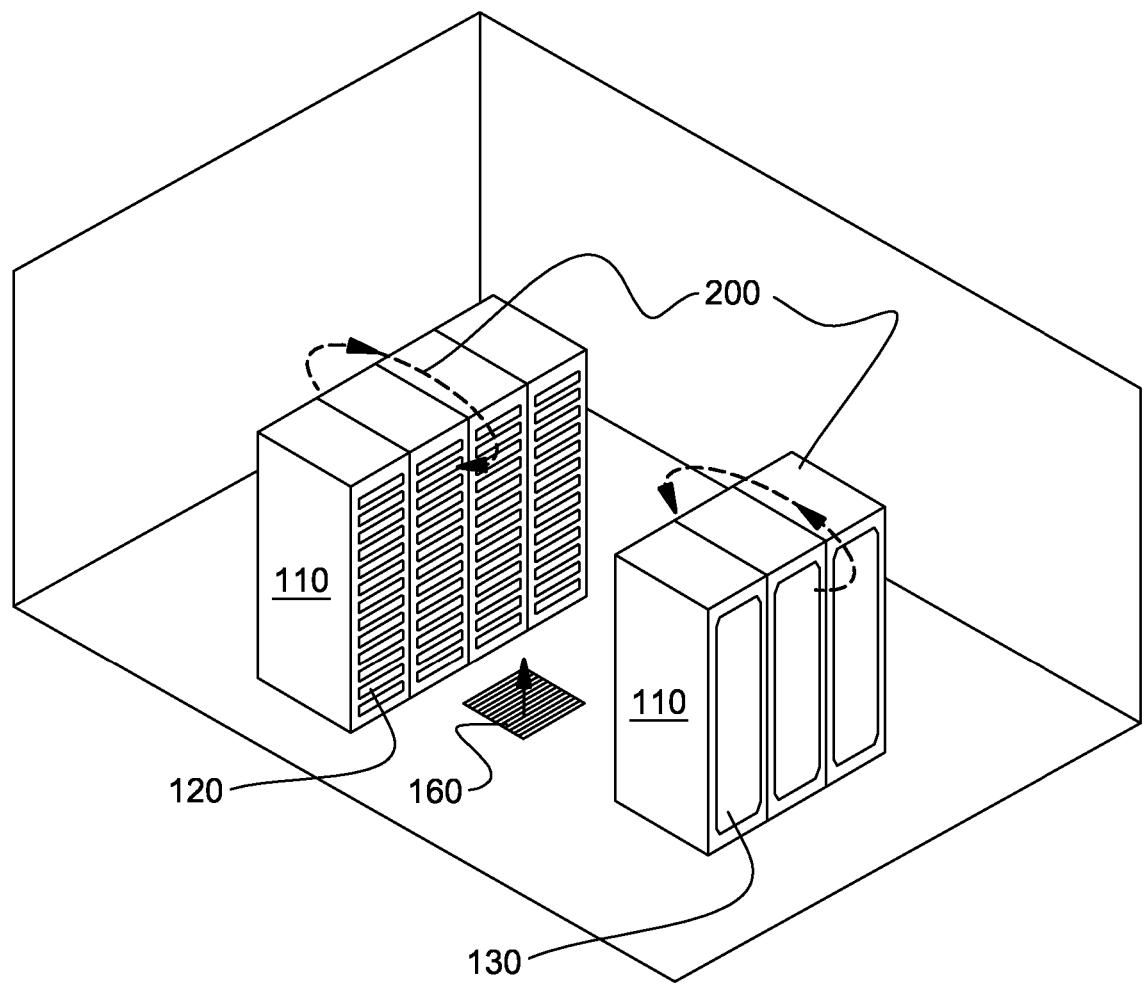
FIG. 2 depicts one problem addressed by the present invention, showing recirculation air flow patterns in one implementation of a raised floor layout of an air cooled computer installation.

Due to the ever increasing airflow requirements through electronics racks, and limits of air distribution within the typical computer room installation, recirculation problems within the room may occur. This is shown in FIG. 2 for a raised floor layout, wherein hot air recirculation 200 occurs from the air outlet sides 130 of the electronics racks back to the cold air aisle defined by the opposing air inlet sides 120 of the electronics rack. This recirculation can occur because the conditioned air supplied through tiles 160 is typically only a fraction of the air flow rate forced through the electronics racks by the air moving devices disposed therein. This can be due, for example, to limitations on the tile sizes (or diffuser flow rates). The remaining fraction of the supply of inlet side air is often made up of ambient room air with some recirculation 200. This recirculating flow is often very complex in nature, and can lead to significantly higher rack unit inlet temperatures than might be expected.

The recirculation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 18-35° C. range. For a raised floor layout such as depicted in FIG. 1, however, temperatures can range from 15-20° C. at the lower portion of the rack, close to the cooled air input floor vents, to as much as 45-50° C. at the upper portion of the electronics rack, where the hot air can form a self-sustaining recirculation loop. Since the allowable rack heat load is limited by the rack inlet air temperature at the "hot" part, this temperature distribution correlates to a lower processing capacity. Also, computer installation equipment almost always represents a high capital investment to the customer. Thus, it is of significant importance, from a product reliability and performance view point, and from a customer satisfaction and business perspective, to establish a substantially uniform temperature across the air inlet side of the rack unit. The efficient cooling of such computer and electronic systems, and the amelioration of localized hot air inlet temperatures to one or more rack units due to recirculation of air currents, are addressed by the apparatuses and methods disclosed herein. Specifically, the apparatuses and methods disclosed herein advantageously enable local air-cooling of air entering or exiting an electronics rack as a supplemental rack cooling solution in a high density data center implementation.

In addition to the recirculation issue noted above, it is becoming more and more difficult and expensive to remove heat from the air of a data center in order to maintain overall data center ambient temperatures within required limits for proper functioning of electronics equipment. The apparatuses and methods disclosed herein advantageously facilitate heat removal by transferring part of the heat load to chilled liquid coolant, rather than ambient air, and to effect this transfer in a manner not detrimental to the thermal or acoustical operating points of the electronics system. Still further, it may be the case that the electronics subsystems within the electronics rack would benefit from a functionality and reliability perspective if the temperature of the air impinging on the electronics were at a lower temperature than ordinarily provided to the inlet of the electronics rack by the room air-conditioning system(s). Thus, the apparatus and methods disclosed herein advantageously enable such lower air temperatures at the air inlet side of the electronics rack in a manner beneficial to the thermal operating points of the electronics subsystems, while not being detrimental to the acoustical operating points of the electronics system.

Figure 3:
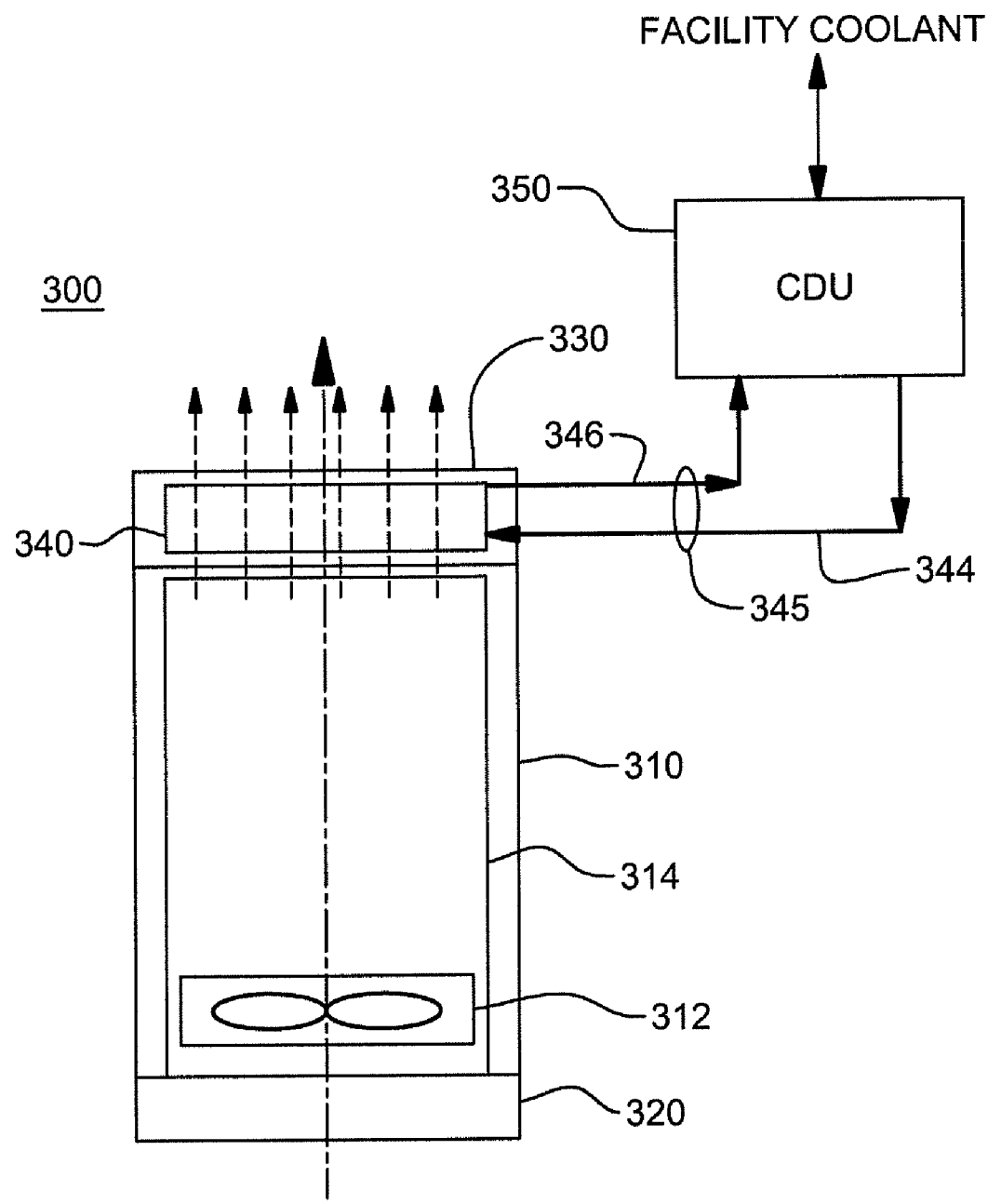
FIG. 3 is a top plan view of one embodiment of an electronics rack with a heat exchange system operatively coupled thereto, in accordance with an aspect of the present invention.

FIG. 3 depicts one embodiment of a cooled electronics system, generally denoted 300, in accordance with an aspect of the present invention. In this embodiment, electronics system 300 includes an electronics rack 310 having an inlet door 320 and an outlet door 330, which have openings to allow for the ingress and egress of external air from the inlet side to the outlet side of electronics rack 310. The system further includes at least one air-moving device 312 for moving external air across at least one electronics subsystem 314 positioned within the electronics rack. Disposed within outlet door 330 is a heat exchanger 340 of a heat exchange system comprising heat exchanger 340, and a coolant distribution unit 350. Heat exchanger 340 removes heat from the exhausted inlet-to-outlet airflow through the electronics rack for transfer via coolant passing there through to coolant distribution unit 350 where, in the embodiment of FIG. 3, heat is exhausted to facility coolant via a liquid-to-liquid heat exchanger (not shown) within coolant distribution unit 350. A coolant loop 345 between heat exchanger 340 and coolant distribution unit 350 is defined by a coolant supply line 344 connecting in fluid communication coolant distribution unit 350 and heat exchanger 340 (via an inlet plenum discussed below), and a coolant return line 346 connected in fluid communication between heat exchanger 340 (via an outlet plenum discussed below) and coolant distribution unit 350. In the alternative, heat exchanger 340 could be disposed within inlet door 320 on the air inlet side of the electronics rack. In this case, heat exchanger 340 would remove heat from inlet air ingressing into the electronics rack employing the above-noted mechanism for transferring heat from air to coolant flowing through the heat exchanger.

Figure 4:
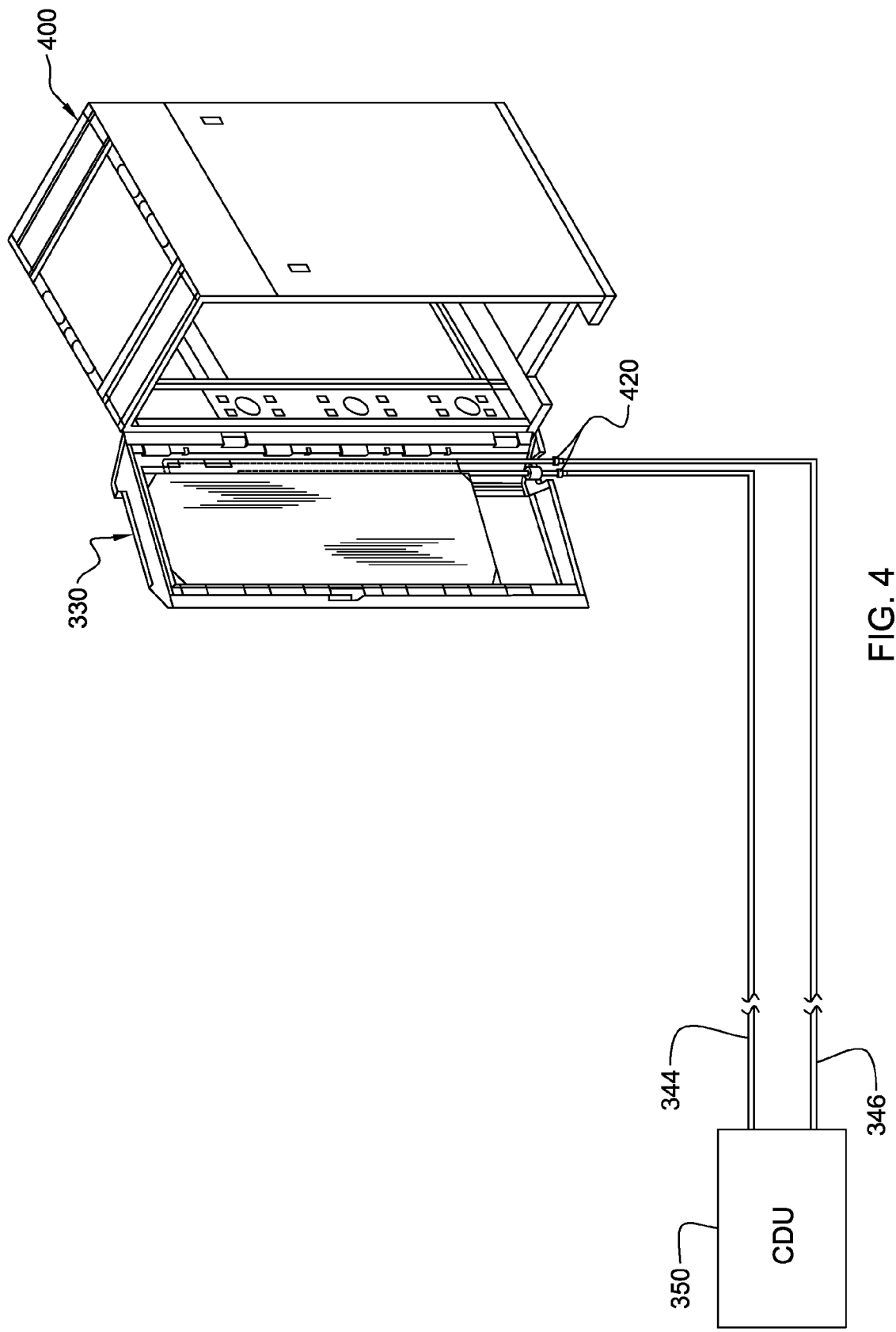
FIG. 4 is an isometric view of one embodiment of an electronics rack frame, heat exchanger door, and heat exchange system, in accordance with an aspect of the present invention.

FIG. 4 depicts further details of one embodiment of an electronics rack frame 400, heat exchanger door 330 hingedly mounted thereto, and a heat exchange system, in accordance with an aspect of the invention disclosed herein. In this embodiment, the heat exchanger is configured to reside within and cover an opening (not shown) in heat exchanger door 330. Further, heat exchanger door 330 is assumed to be (in one implementation) a modified door. This modified door is designed to replace an existing outlet door cover (not shown) of the electronics rack, in which case the modified door and heat exchanger disclosed herein may be retrofitted to an existing electronics rack within a conventional data center. As explained further below, one feature of the present invention is that airflow impedance through the modified door (i.e., heat exchanger door and noise-reducing attachment apparatus mounted thereto) is similar to airflow impedance through an existing door of the electronics rack. This is achieved, in one aspect, by designing the heat exchanger to balance airflow impedance through the heat exchanger with air-to-liquid heat exchange efficiency of the system. By trading off heat exchange efficiency, airflow impedance through the heat exchanger can be controlled. This advantageously allows use of a heat exchanger (and noise-reducing attachment apparatus) such as disclosed herein, without requiring additional air-moving devices within the electronics rack or associated with the heat exchanger door to achieve the desired goal of alleviating heat load on the computer room air-conditioning units.

As shown in FIG. 4, the heat exchange system includes, in addition to the heat exchanger of the heat exchanger door 330, connect couplings 420, which in one embodiment, are disposed adjacent to the edge of the heat exchanger door configured to hingedly mount to the electronics rack. These connect couplings may be any one of various types of commercially available couplings. For example, mechanical flare connections may be employed as connect couplings 420.

Coolant supply and return lines 344, 346 run the majority of the distance between coolant distribution unit 350 and connect couplings 420 (mounted to heat exchanger door 330). These lines may be fixed plumbing. For example, copper tubing could be employed. Within one embodiment, flexible stainless steel hosing (not shown), may be employed to couple the coolant supply and return lines 344, 346 to the connect couplings 420. These flexible hoses would allow for rotational movement of the heat exchanger door about the hinge access, and the size of the flexible hoses may be relatively small, for example, on the order of one to three meters. Thus, the amount of flexible hosing required to circulate the coolant within the heat exchange system is minimized, thereby providing greater reliability.

Figure 5:
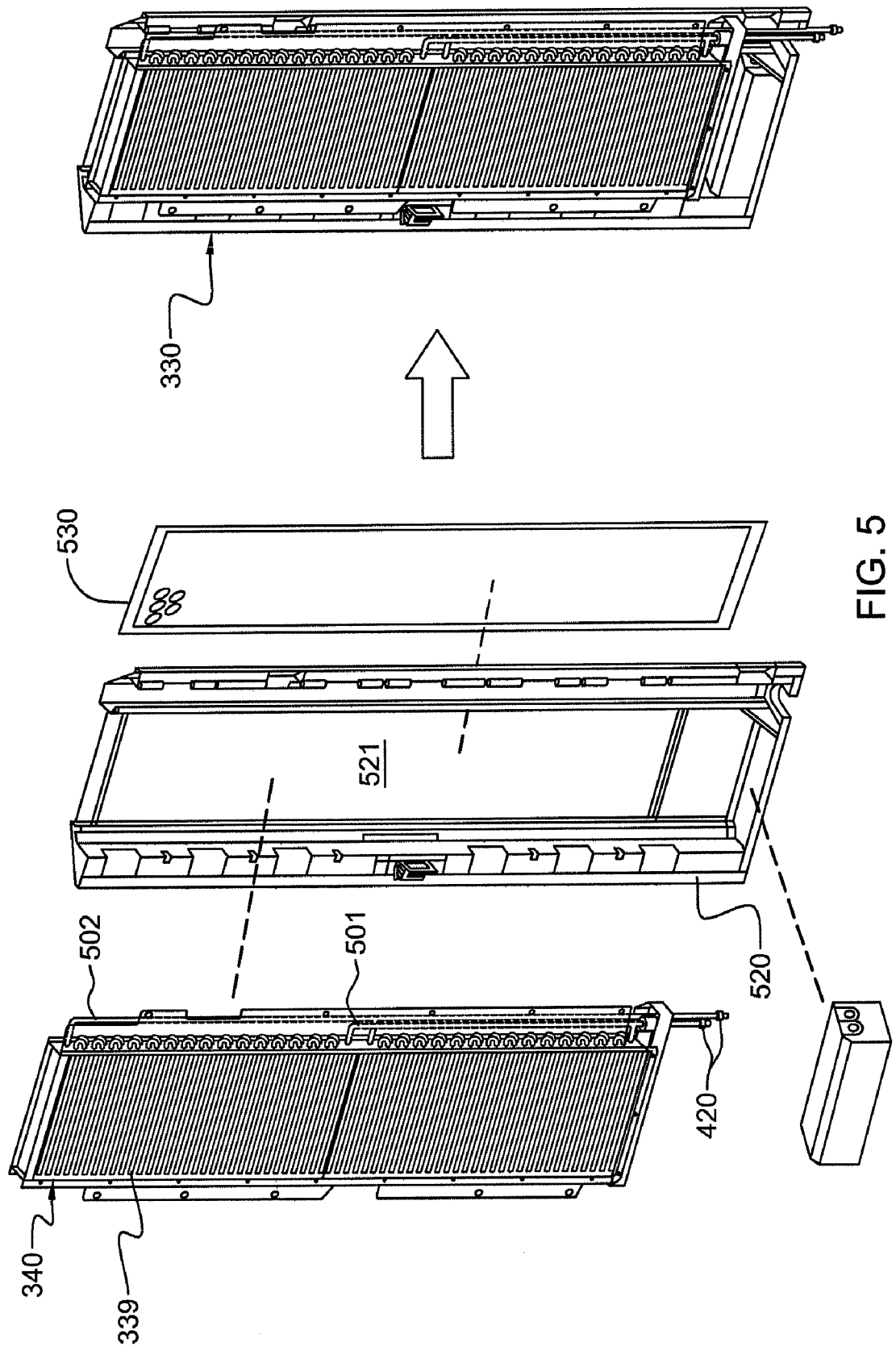
FIG. 5 is a partially exploded isometric view of one embodiment of a heat exchanger door, including a heat exchange coil and inlet and outlet plenums of the heat exchange system, in accordance with an aspect of the present invention.
Figure 6:
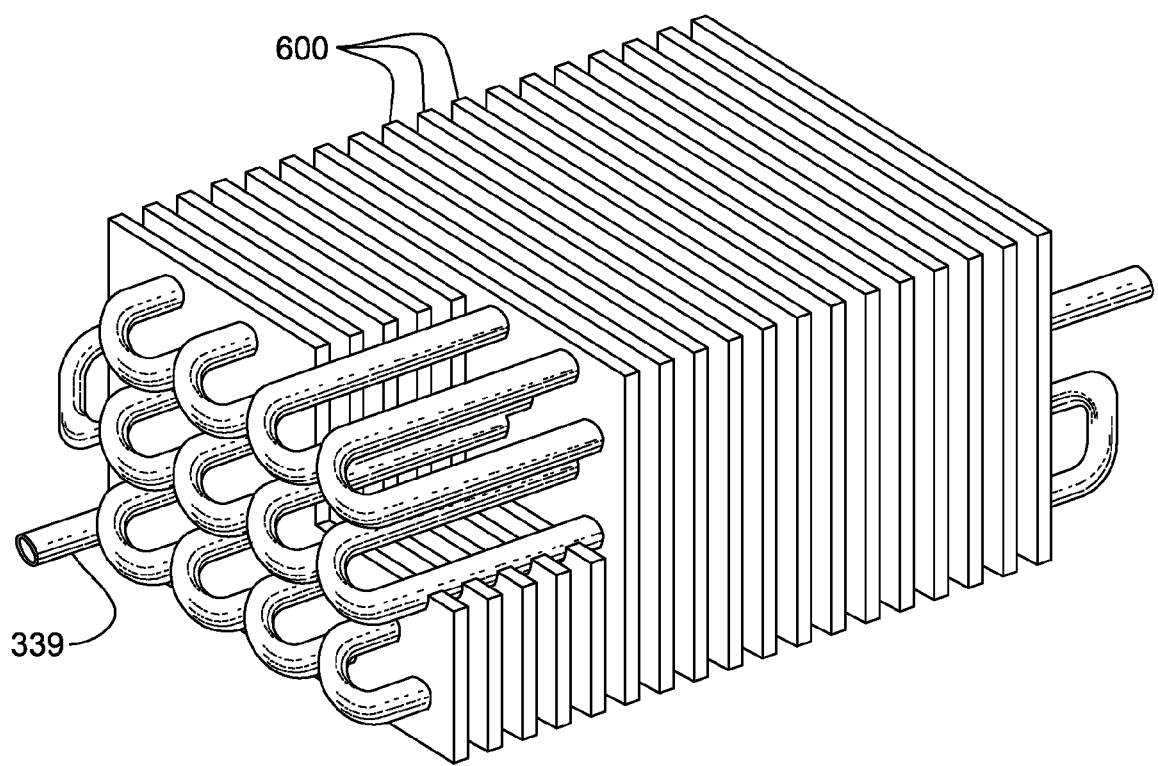
FIG. 6 is a partially cut-away, partial isometric view of one embodiment of a heat exchange coil comprising a plurality of fins surrounding and extending from a core tube section, in accordance with an aspect of the present invention.

FIG. 5 depicts additional details of one embodiment of a heat exchanger door, in accordance with the invention disclosed herein. As shown at the left portion of the figure, heat exchanger 340 includes one or more tube sections 339, which in one embodiment, may have a plurality of fins (see FIG. 6) projecting therefrom. Depending upon the implementation, tube sections 339 may comprise a single, serpentine channel, or a plurality of discrete heat exchange tube sections coupled together via inlet and outlet plenums 501, 502 disposed at the edge of the heat exchanger door configured to hingedly mount to the electronics rack. In one embodiment, two discrete heat exchange tube sections (e.g., an upper tube section and a lower tube section) are employed as the heat exchanger. As shown, the one or more heat exchange tube sections are sized to substantially cover the entire opening 521 in the frame 520 of the heat exchanger door.

In the depicted embodiment, the two heat exchange tube sections are fed coolant by coolant inlet plenum 501 and exhaust coolant via coolant outlet plenum 502. Flexible hoses (not shown) may be employed for connecting to hard plumbing disposed near the electronics rack. These hoses would be brought into heat exchanger door 330 adjacent to the hinge axis of the door.

In the embodiment of FIG. 5, a raised floor embodiment is assumed where hoses are routed through floor tile cut-outs (not shown) into heat exchanger door 330 for connecting to connect couplings 420. In a non-raised floor environment, right angle adapters could be installed at the edge of each hose to allow the coolant to make a sharp turn at the base of the heat exchanger door. The hoses are configured to plug into each manifold via industry standard, hydraulic, quick connect couplings. Once the hoses are plugged into the respective couplings and secured, the hoses (or adapters) rotate around each other as the heat exchanger door 330 is pivoted open and closed, providing a minimum of movement to the hoses. (See FIGS. 7A & 7B.)

Continuing with FIG. 5, one embodiment of an optional perforated planar surface 530 is illustrated. First and second such perforated planar surfaces 530 could be provided for covering first and second main sides of the heat exchanger. In one embodiment, the perforated planar surfaces comprise metal plates having appropriate air flow openings to allow inlet-to-outlet airflow through the electronics rack to readily pass through the heat exchanger. One embodiment of airflow openings in the perforated planar surfaces is depicted in FIG. 5. In this embodiment, the perforated planar surface has a plurality of openings disposed throughout the plate. As one example, these openings may comprise hexagon-shaped openings which maximize air flow through the perforated surfaces, while still providing the desired isolation of the heat exchanger.

Each heat exchange tube section illustrated in FIG. 5 may comprise at least one of a continuous tube or multiple tubes connected together to form one continuous serpentine cooling channel. In the embodiment shown, each heat exchange tube section is a continuous tube having a first diameter, and each plenum 501, 502, is a tube having a second diameter, wherein the second diameter is greater than the first diameter. The first and second diameters are chosen to ensure adequate supply of coolant flow through the multiple tube sections. In one embodiment, each heat exchange tube section may align to a respective electronics subsystem of the electronics rack.

Although not shown in FIG. 5, the heat exchange tube sections further include a plurality of fins (such as fins 600 in FIG. 6) extending from tube(s) 339 to facilitate heat transfer, for example, from air exhausted out the back of the electronics rack to coolant flowing through the serpentine cooling channels of the individual heat exchange tube sections. In one embodiment, the plurality of fins comprise aluminum fins extending from the individual tubes, which could be constructed of copper tubing. Further, in one implementation, the fins are brazed to the tubing. As explained above, the positioning, density, thickness and depth of the fins are selected to control airflow impedance through the resultant heat exchanger. Additionally, the number and diameter of tubes of the individual heat exchange tube sections, as well as the size, configuration and placement of the air flow openings in the first and second perforated planar surfaces are selected to control the overall air flow impedance through the heat exchanger. By so controlling the airflow impedance, the resultant heat exchange effectiveness of the heat exchanger is expected to be less than optimal. For example, a heat exchange effectiveness (defined as a ratio of heat removed by the heat exchanger to the heat dissipated within the electronics rack) of 50%-60% may be required in order to achieve a desired air flow impedance through the assembly. As noted, one design objective for the heat exchanger is that the exchanger, when mounted to the door, has an air flow impedance which is similar to the air flow impedance of any existing door of an existing electronics rack installation to which the assembly is to be attached. By so matching, or reducing, the air flow impedance, the need for an additional air-moving device is avoided. By way of specific example, if an electronics rack has a total air flow of 1500 cfm (cubic feet per minute), and the pressure drop across the existing door at that air flow is 0.03 inches of water, then the heat exchanger is designed to have an air side pressure drop of less than or equal to 0.03 inches of water at 1500 cfm. Under this condition, the heat exchange effectiveness may be 50%-60%, but it is still more than adequate to alleviate heat load on the room air-conditioning unit(s) of a computer room installation. The materials and wall thickness are chosen to accommodate the air impedance design. Strict braze processing definition and control are employed along with multiple test points in the build process for robust, controlled component fabrication. In combination, these considerations contribute to and ensure a leak-proof, highly reliable product, which meets the design objectives.

Figure 7B:
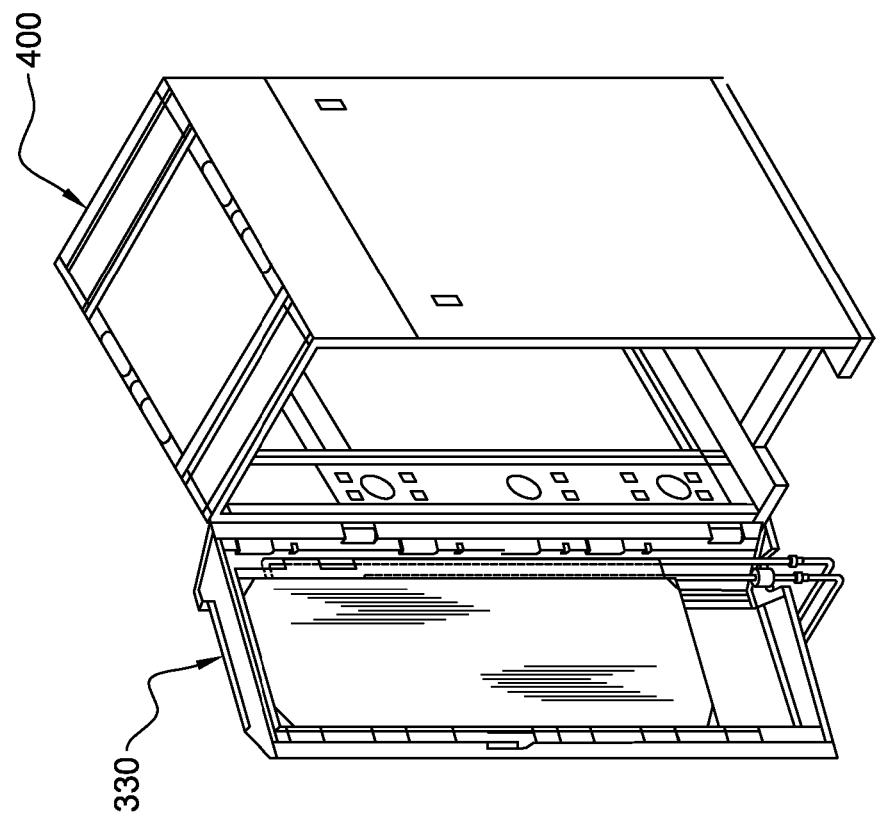
FIG. 7B is an isometric view of the structure of FIG. 7A, showing the heat exchanger door in an open position relative to the electronics frame, in accordance with an aspect of the present invention.
Figure 7A:
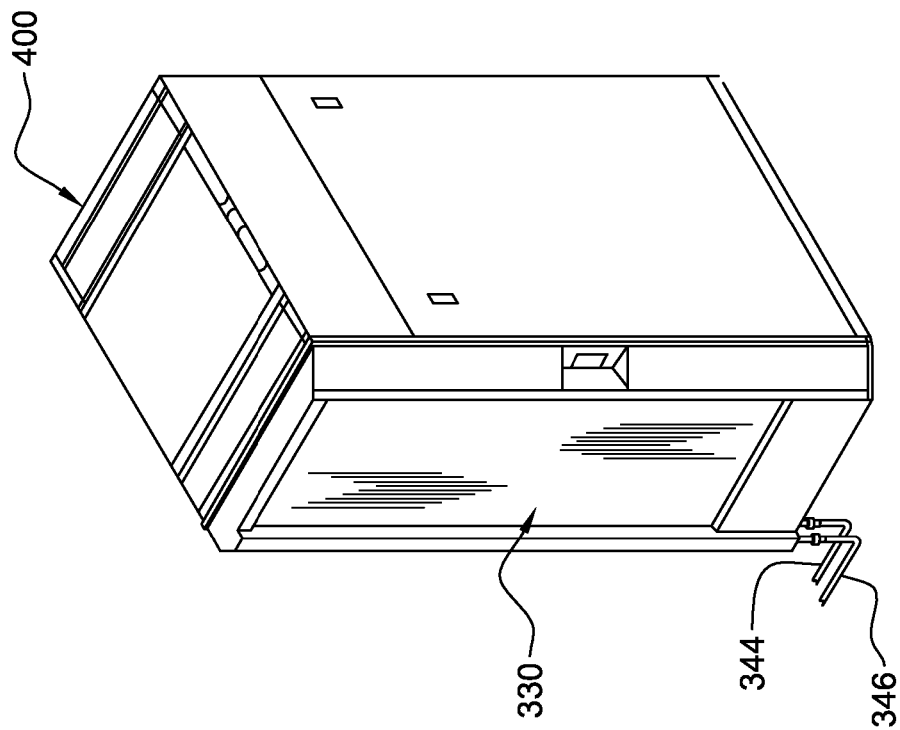
FIG. 7A is an isometric view of the partially assembled structure of FIG. 4, showing the heat exchanger door hingedly secured to the electronics frame and in a closed position relative to the electronics frame, in accordance with an aspect of the present invention.

FIG. 7A depicts heat exchanger door 330 in a closed position relative to electronics rack frame 400, and shows coolant supply and return lines 344, 346 extending, for example, below a raised floor (not shown). In FIG. 7B, heat exchanger door 330 is shown pivoted to an open position, allowing access to the electronics rack frame 400.

As an enhancement, FIGS. 8A-12C depict various embodiments of a noise-reducing attachment apparatus configured to mount to a heat exchanger door, such as described above, to provide acoustical attenuation within the data center. As noted initially, with the large number of electronics racks in many data center installations, acoustical noise generated by componentry within the electronics racks may result in data center noise rising to unacceptably high levels. The noise-reducing attachment apparatuses described hereinbelow advantageously allow the cooling benefits of a heat exchanger door to be realized, while still mitigating noise emanating from the electronics rack. Conceptually, the noise-reducing attachment apparatuses disclosed herein are readily attachable, or insertable, into mating engagement with a heat exchanger door. The noise-reducing attachment apparatus provides acoustical attenuation while still allowing air to egress or ingress through the electronics rack with relatively low airflow impedance. In one embodiment, airflow impedance through the heat exchanger door and noise-reducing attachment apparatus is designed to be roughly equivalent to airflow impedance through an existing air inlet side or air outlet side door of an electronics rack. Further, the acoustical attenuation provided by the noise-reducing attachment apparatus is designed to be roughly equivalent to any acoustical attenuation currently provided by an existing door mounted to the air inlet side or air ou-tlet side of the electronics rack.

As explained further below, the noise-reducing attachment apparatus provides surfaces and blockages in the noise path from noise sources inside the electronics rack to the data center room environment. Acoustically absorptive material, such as acoustical foam (e.g., fiberglass or polyurethane foam), may be employed to attenuate noise emanating from the electronics rack. Noise energy which would otherwise be free to pass directly through the heat exchanger door into the data center without attenuation, is forced to impinge on the absorptive material and be partially absorbed by it. In addition, the noise energy after impinging upon and passing through the acoustical material, is reflected back by the rigid outer shell of the noise-reducing attachment apparatus through the acoustical material, either into the interior of the electronics rack or into other acoustical material on other sections of the noise-reducing attachment apparatus. The shapes and angles of surfaces of the noise-reducing attachment apparatus, including the outer shell and interior sections thereof, are designed to maximize the acoustical absorption, while at the same time minimizing added pressure drop and flow impedance through the noise-reducing attachment apparatus itself.

FIG. 8A is an isometric view of one embodiment of a heat exchanger door to which a noise-reducing attachment apparatus is to be mounted, in accordance with an aspect of the present invention. This heat exchanger door, generally denoted 800, includes a door frame 801 having an air opening therein filled by an air-to-liquid heat exchanger 802. Thus, air passing through the heat exchanger door 800 is cooled by the heat exchanger 802 before ingressing into or egressing from the electronics racks to which the heat exchanger door is hingedly coupled. In one embodiment, door frame 801 is provided with one or more grooves or notches 803, 804, for example, in or adjacent to the top and bottom surfaces thereof, to facilitate mounting of a noise-reducing attachment apparatus such as described hereinbelow. These grooves 803, 804 are (in one embodiment) sized and configured to receive a corresponding tongue on the noise-reducing attachment apparatus.

By using a tongue and groove mounting approach, the noise-reducing attachment apparatus 810 illustrated in FIG. 8B can be readily secured to the heat exchanger door 800. In the embodiment illustrated, a upper tongue 813 and a lower tongue 814 are sized and configured to engage the respective groves 803, 804 in the heat exchanger door, and thereby facilitate ready mounting of the noise-reducing attachment apparatus to the heat exchanger door.

As illustrated in FIGS. 8B & 8C, noise-reducing attachment apparatus 810 comprises a frame structure 815 having a first side fin 820 and a second side fin 821. A top surface and bottom surface respectively include the upper tongue 813 and lower tongue 814. A centrally disposed structure 825, such as a wedge-shaped center fin, is provided to facilitate bifurcating of airflow passing through the air opening of the heat exchanger door into a first airflow channel and a second airflow channel (described further below in connection with FIGS. 9A-9C). When mounted to the heat exchanger door using the tongue-and-groove attachment mechanism, a first edge of first side fin 820 a second edge of second side fin 821, mount flush to an exterior surface of the heat exchanger door. Those skilled in the art will note that although described herein as a tongue-and-groove attachment mechanism, any securement mechanism for securing the noise-reducing attachment apparatus to the heat exchanger door may be employed. In one embodiment, the noise-reducing attachment apparatus readily clips or snaps onto the heat exchanger door, and allows for air to flow through the heat exchanger door while still providing acoustical absorption of noise energy emanating from the electronics rack to which the heat exchanger door is hingedly connected.

Figure 9A:
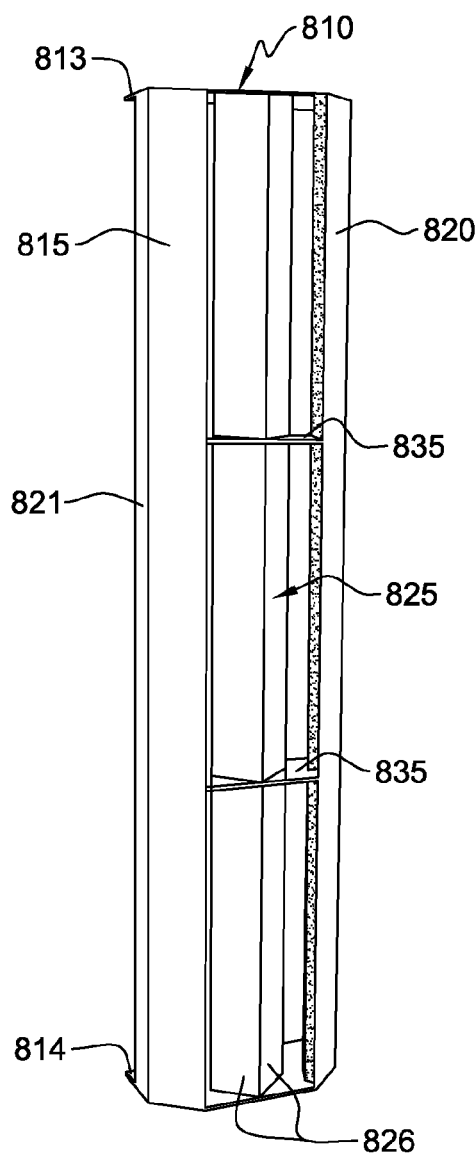
FIG. 9A is an exterior isometric view of one embodiment of a noise-reducing attachment apparatus for a heat exchanger door, in accordance with an aspect of the present invention.

FIG. 9A is an exterior isometric view of noise-reducing attachment apparatus 810, wherein the exterior surfaces form an attachment or outer shell that provides support and rigidity to the noise-reducing attachment apparatus. The shell includes first side fin 820, second side fin 821 and centrally disposed structure 825. As illustrated, first side fin 820 and second side fin 821 are angled to increase the surface area for noise attenuation, and are coupled (along with structure 825) between the top surface and bottom surface of noise-reducing attachment apparatus 810. As noted, the top surface includes upper tongue 813 and the bottom surface lower tongue 814, which facilitate mounting of the noise-reducing attachment apparatus to the heat exchanger door, as described above. In one embodiment, first side fin 820, second side fin 821 and centrally disposed structure 825 define an attachment shell of a structurally rigid material, such as a metal. Multiple horizontal fins 835 are provided to enhance structural rigidity of the noise-reducing attachment apparatus.

Figure 9B:
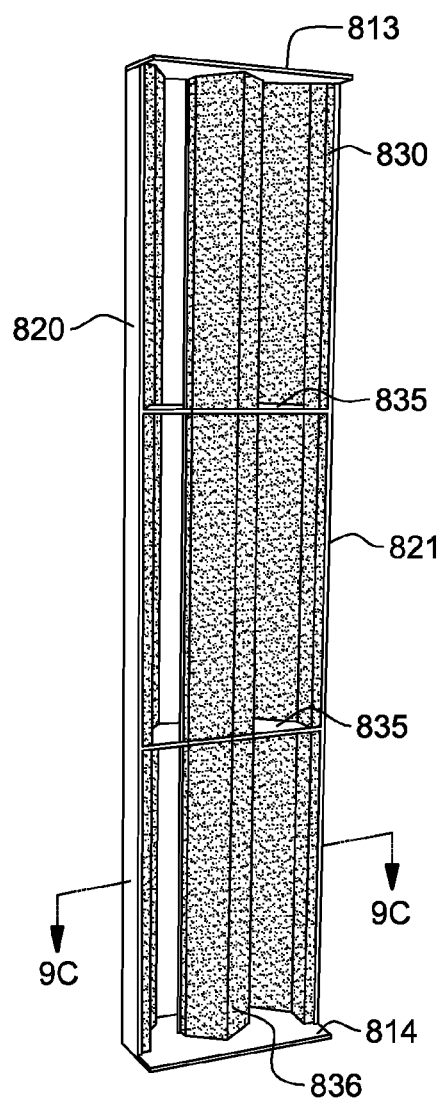
FIG. 9B is an interior isometric view of the noise-reducing attachment apparatus FIG. 9A, in accordance with an aspect of the present invention.
Figure 9C:
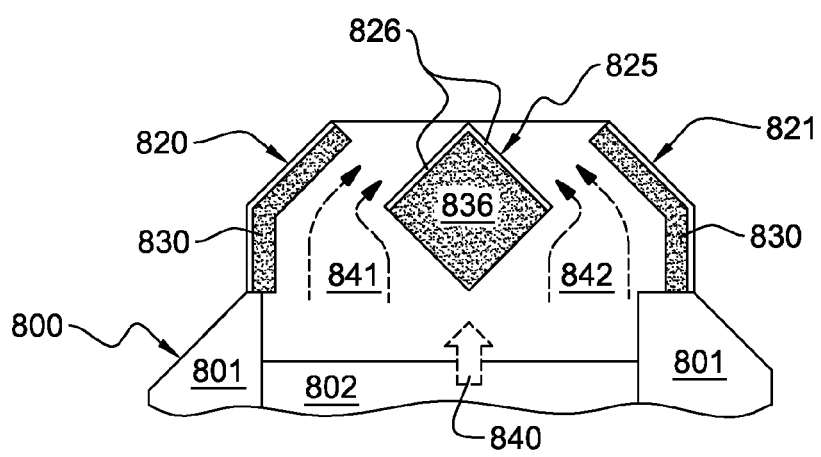
FIG. 9C is a cross-sectional plan view of the noise-reducing attachment apparatus of FIGS. 9A & 9B, taken along line 9C-9C in FIG. 9B, in accordance with an aspect of the present invention.

As illustrated in FIG. 9B, the interior surfaces of the noise-reducing attachment apparatus are covered with an acoustically absorptive material 830 for attenuating noise emanating from the electronics rack. FIG. 9C is a cross-sectional plan view of the noise-reducing attachment apparatus 810, taken along line 9C-9C in FIG. 9B, with the apparatus shown mounted in position against the door frame 801 of heat exchanger door 800. As illustrated, the noise-reducing attachment apparatus 810 defines a first airflow channel 841 and a second airflow channel 842, resulting in bifurcation of airflow 840, exiting from the electronics rack across the heat exchanger 802. As noted above, the noise-reducing attachment apparatuses described herein could alternatively be employed in connection with a heat exchanger door disposed at the air inlet side of an electronics rack, in which case, airflow directions would be reversed through the noise-reducing attachment apparatus.

In the cross-sectional embodiment of FIG. 9C, structure 825 is shown to comprise an angled shell 826 and a square or rectangular section of acoustically absorptive material 836. Acoustically absorptive material 830, 836 is coupled to the interior surfaces of the first side fin 820, second side fin 821 and angled shell 826 to facilitate absorption of noise energy emanating from the electronics rack. Further, noise energy after impinging on the acoustical material 830, 836 is reflected by the rigid outer surfaces of first side fin 820, second side fin 821 and angled shell 826 back towards the electronics rack, thereby further reducing escaping noise.

Figure 10A:
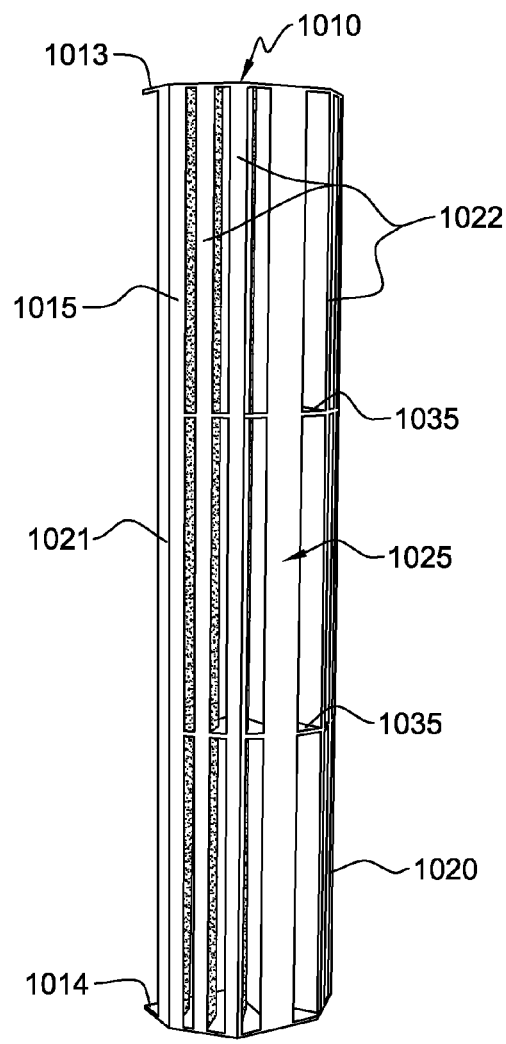
FIG. 10A is an exterior isometric view of another embodiment of a noise-reducing attachment apparatus for a heat exchanger door, in accordance with an aspect of the present invention.
Figure 10B:
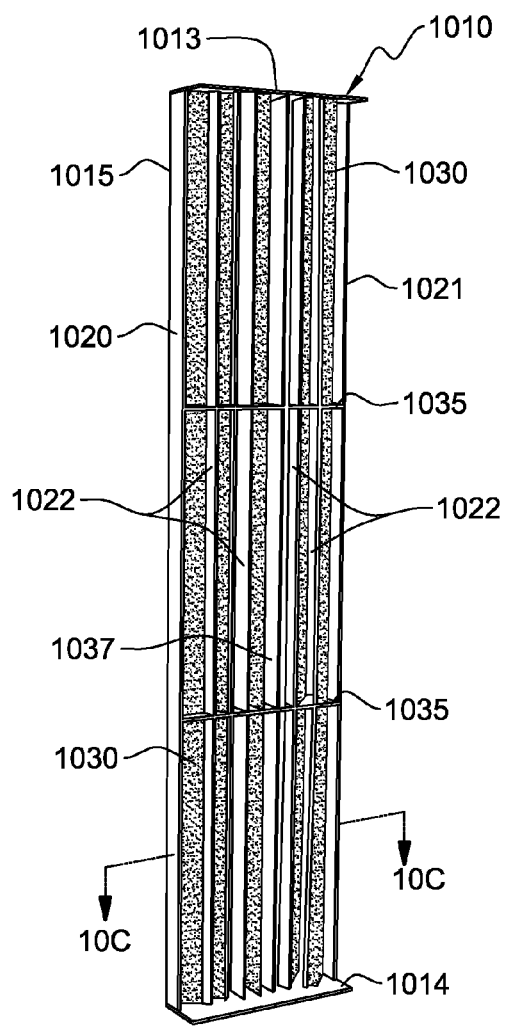
FIG. 10B is an interior isometric view of the noise-reducing attachment apparatus of FIG. 10A, in accordance with an aspect of the present invention.
Figure 10C:
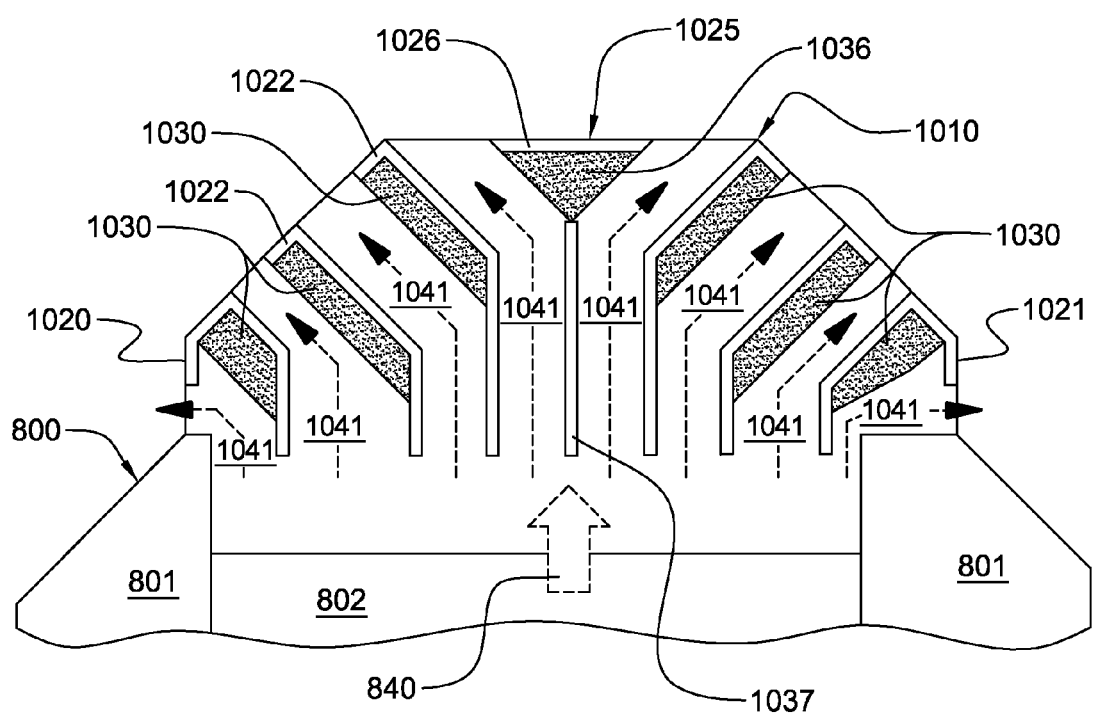
FIG. 10C is a cross-sectional plan view of the noise-reducing attachment apparatus of FIGS. 10A & 10B, taken along line 10C-10C in FIG. 10B, in accordance with an aspect of the present invention.

FIGS. 10A-10C depict an alternate embodiment of a noise-reducing attachment apparatus 1010, in accordance with an aspect of the present invention. Referring collectively to FIGS. 10A-10C, noise-reducing attachment apparatus 1010 comprises exterior surfaces 1015 defined by a first side fin 1020, second side fin 1021, a plurality of intermediate fins 1022 and a centrally disposed structure 1025. Together these structures provide support and rigidity to the noise-reducing attachment apparatus, and define, in part, a plurality of airflow channels 1041 through which airflow 840 exhausting across heat exchanger 802 flows. Angling the airflow channels as illustrated, increases blockages for enhanced noise suppression. Acoustically absorptive material 1030 is disposed within the interior regions defined by first side fin 1020, second side fin 1021 and intermediate fins 1022, as illustrated in FIGS. 10B & 10C.

An upper tongue 1013 extends from the top surface of noise-reducing attachment apparatus 1010 and a lower tongue 1014 extends from the lower surface of the noise-reducing attachment apparatus. These tongues mate with respective grooves in the heat exchanger door to facilitate ready attachment of the apparatus to the heat exchanger door, as described above. In one embodiment, first side fin 1020 second side fin 1021, intermediate fins 1022 and centrally disposed structure 1025 define an attachment or outer shell which is fabricated, for example, of a structurally rigid material such as a metal. Multiple horizontal fins 1035 are provided to enhance structural rigidity of the noise-reducing attachment apparatus. The noise-reducing attachment apparatus is illustrated in FIGS. 10A & 10B to comprise an elongate structure sized to cover the air opening in the heat exchanger door 800 through which air passes (that is, across heat exchanger 802 of the heat exchanger door).

In the cross sectional view of FIG. 10C, centrally disposed structure 1025 is shown to comprise a flat shell 826 and a triangular section of acoustically absorptive material 1036. Acoustically absorptive material is shown to cover the majority of the interior surfaces of the noise-reducing attachment apparatus, and presents significant blockages to noise emanating from the electronics rack to which the heat exchanger door is attached. Further, noise energy impinging on the acoustically material 1030, 1036 is reflected by the rigid outer surfaces of first side fin 1020, second side fin 1021, and intermediate fins 1022 and outer shell 1026 back towards the electronics rack, thereby further suppressing noise from the electronics rack. As illustrated, the first side fin 1020, second side fin 1021, and intermediate fins 1022 are provided with a fin portion extending parallel to the direction of airflow 840 exhausting from across heat exchanger 802. Additionally, a centrally disposed fin 1037 is provided. Together, these fins or fins portions direct the airflow into the airflow channels 1041, thereby reducing air impedance of the noise-reducing attachment apparatus.

Referring collectively to FIGS. 8A-10C, the embodiments illustrated have an overall trapezoidal cross-section, wherein sides of the heat exchanger door are angled. For example, reference the angling to door frame 801, as well as the angling of the outer exterior surface of the noise-reducing attachment apparatus in the various embodiments. As a specific example, reference the angling of first side fin 820 and second side fin 821 in FIG. 9C, as well as the angling of first and second side fins 1020, 1021 and intermediate fins 1022 in FIG. 10C. This aspect of the various embodiments allows the heat exchanger door, when hingedly coupled to the air inlet or air outlet side of the electronics rack to be opened without interference with a similar door assembly on an immediately adjacent electronics rack similarly configured. Although advantageous when similarly configured electronics racks are positioned side-by-side, this configuration is not essential, particularly where electronics racks are employed individually or in spaced relation.

Figure 11A:
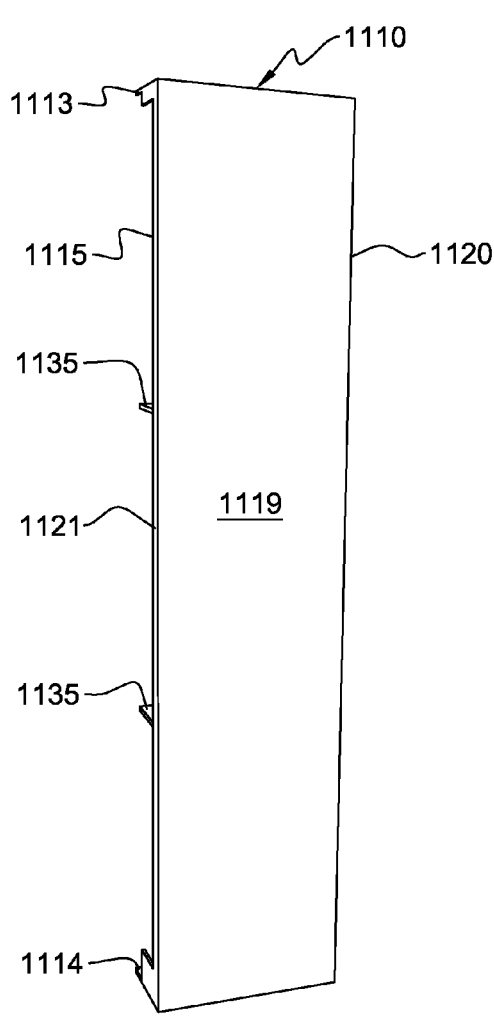
FIG. 11A is an exterior isometric view of another embodiment of a noise-reducing attachment apparatus for a heat exchanger door, in accordance with an aspect of the present invention.
Figure 11B:
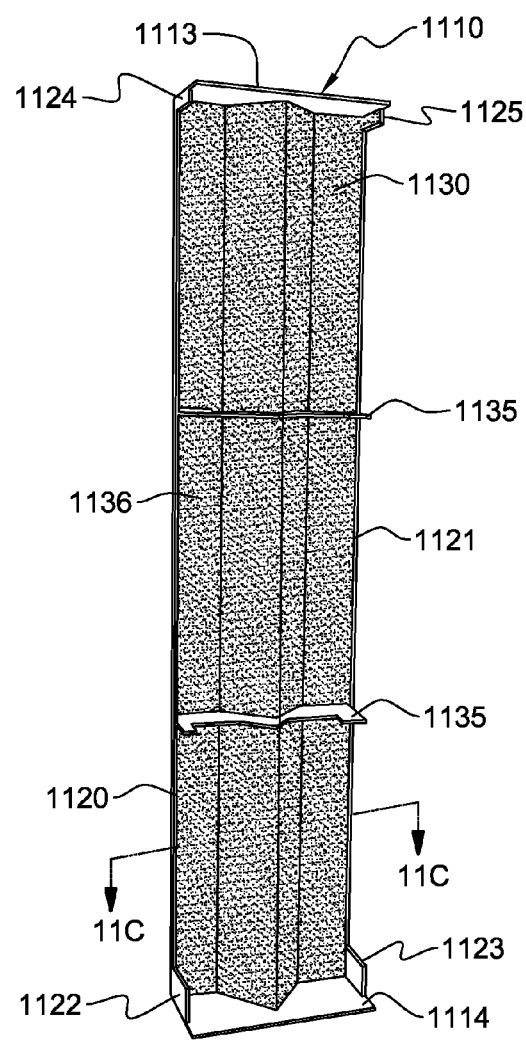
FIG. 11B is an interior isometric view of the noise-reducing attachment apparatus of FIG. 11A, in accordance with an aspect of the present invention.
Figure 11C:
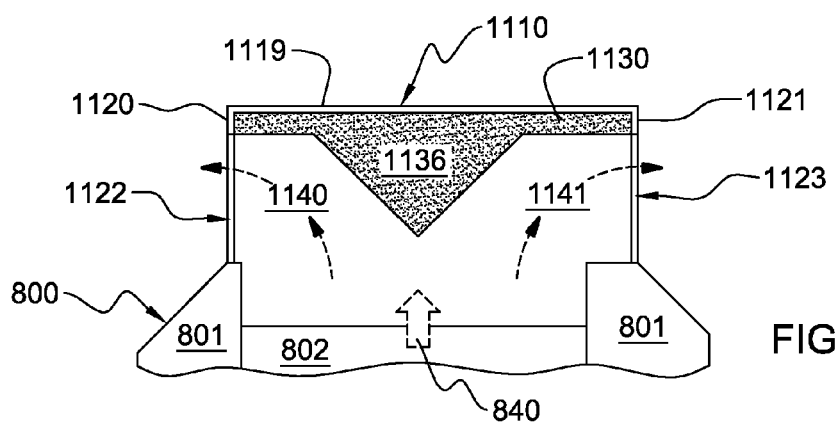
FIG. 11C is a cross-sectional plan view of the noise-reducing attachment apparatus of FIGS. 11A & 11B, taken along line 11C-11C in FIG. 11B, in accordance with an aspect of the present invention.

FIGS. 11A-11C depict another embodiment of a noise-reducing attachment apparatus 1110, in accordance with an aspect of the present invention. Referring collectively to FIGS. 11A-11C, noise-reducing attachment apparatus 1110 includes a frame structure 1115 which comprises in part a solid, outer shell 1119 having a first side 1120 and a second side 1121. Outer shell 1119 extends from the lower surface to the upper surface of the noise-reducing attachment apparatus as illustrated in FIGS. 11A & 11B. An upper tongue 1113 extends outwards from the upper surface, and a lower tongue 1114 extends outward from the lower surface. Those tongues are configured and sized for ready attachment to respective grooves in the heat exchanger door, as described above. The frame structure 1115 further comprises a first lower side edge 1122, a second lower side edge 1123, a first upper side edge 1124 and a second upper side edge 1125. Together, these side edges engage the heat exchanger door, as illustrated in FIG. 11C and space the outer shell 1119 from the heat exchanger door. Thus, a first side opening is defined between first lower side edge 1122 and first upper side edge 1124, and a second side opening is defined between second lower side edge 1123 and second upper side edge 1125 that is, when the noise-reducing attachment apparatus is physically engaged with the heat exchanger door.

As illustrated in FIG. 11C, airflow 840 exiting from across heat exchanger 803 bifurcates into one of a first airflow channel 1140 or second airflow channel 1141 defined by the noise-reducing attachment apparatus. Thus, airflow exits the noise-reducing attachment apparatus in a direction transverse to airflow 840 passing across the heat exchanger. Advantageously, the interior surface of outer shell 1119 is covered with acoustically absorptive material 1130, which attenuates noise escaping from the electronics rack across the heat exchanger door. The acoustically absorptive material is configured with a wedged shaped center region 1136, which facilititates bifurcation and flow of air through the noise-reducing attachment apparatus. Although depicted coupled to the heat exchanger door at an outlet side of electronics rack, the noise-reducing attachment apparatus could alternatively be employed in connection with a heat exchanger door disposed at the air inlet side of the electronics rack, in which case, airflow directions are reversed through the noise-reducing attachment apparatus. Multiple horizontal fins 1135 are provided in the frame structure to enhance structural rigidity of the noise-reducing attachment apparatus.

Figure 12A:
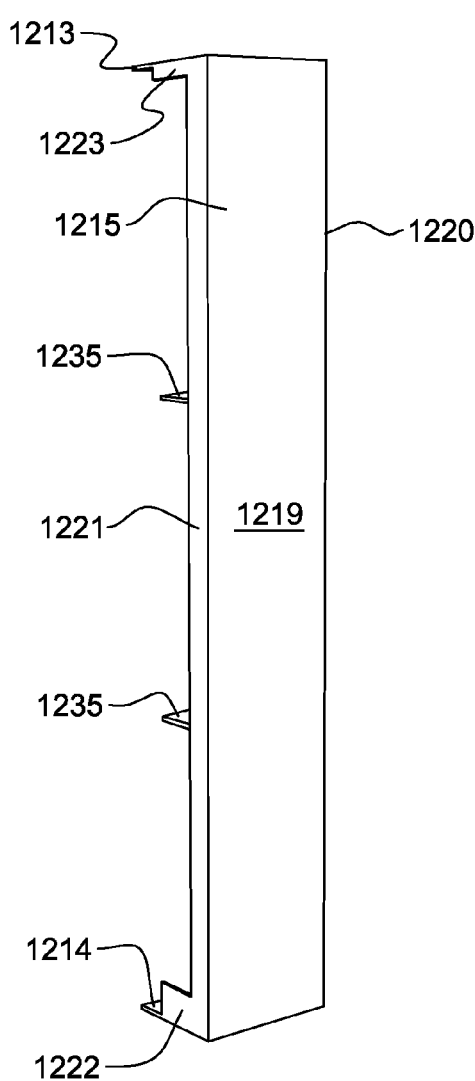
FIG. 12A is an exterior isometric view of another embodiment of a noise-reducing attachment apparatus for a heat exchanger door, in accordance with an aspect of the present invention.
Figure 12B:
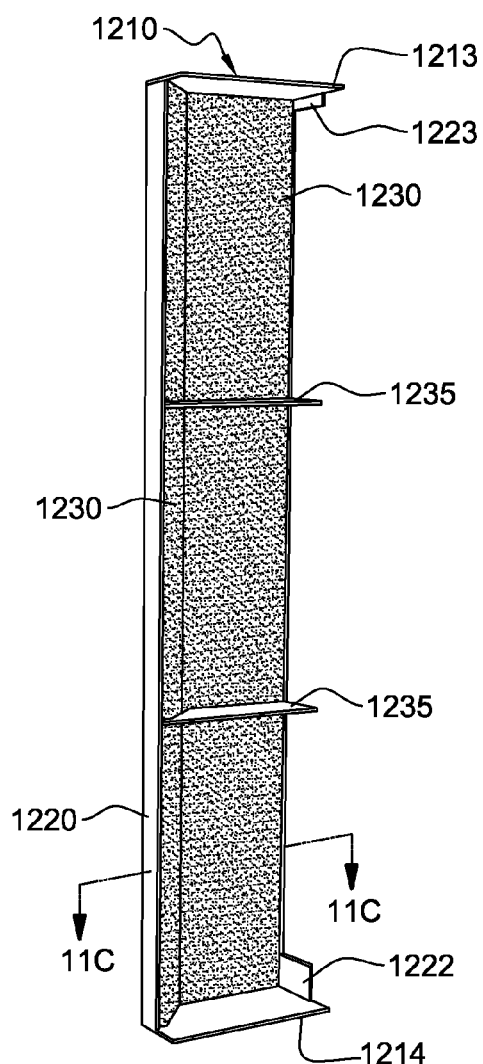
FIG. 12B is an interior isometric view of the noise-reducing attachment apparatus of FIG. 12A, in accordance with an aspect of the present invention.
Figure 12C:
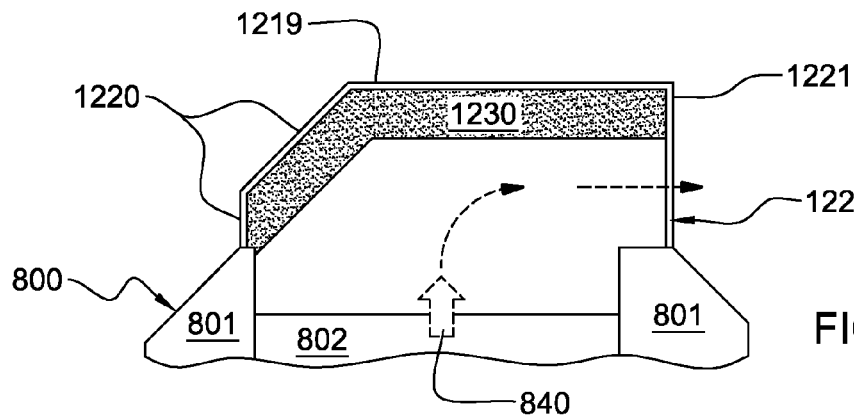
FIG. 12C is a cross-sectional plan view of the noise-reducing attachment apparatus of FIGS. 12A & 12B, taken along line 12C-12C in FIG. 12B, in accordance with an aspect of the present invention.

FIGS. 12A-12C depicts a similar embodiment to the noise-reducing attachment apparatus depicted in FIGS. 11A-11C. However, in the alternate embodiment of FIGS. 12A-12C, the noise-reducing attachment apparatus 1210 directs exiting airflow 840 out one side of the noise-reducing attachment apparatus only.

Referring collectively to FIGS. 12A-12C, noise-reducing attachment apparatus 1210 comprises a frame structure 1215 which includes, in part, an outer shell 1219 that is disposed in spaced relation to the heat exchanger 802 of the heat exchanger door 800 when the noise-reducing attachment apparatus is mounted to heat exchanger door as illustrated in FIG. 12C. An angled side surface 1220, an upper tongue 1213 and a lower tongue 1214 are also provided to couple outer shell 1219 to frame door 801 when the noise-reducing attachment apparatus is mounted to the heat exchanger door 800. A second side fin 1221 only partially extends towards the heat exchanger door, with a lower fin portion 1222 and an upper fin portion 1223 thereof projecting outward a sufficient distance to engage the heat exchanger door when the noise-reducing attachment apparatus is mounted thereto. Thus, a side air opening is formed as illustrated in FIG. 12C where airflow exits the noise-reducing attachment apparatus in a direction transverse to airflow 840 exiting from across heat exchanger 802. As illustrated in FIGS. 12B & 12C, interior surfaces of noise-reducing attachment apparatus 1220 are covered with a acoustically absorptive material 1230 selected to attenuate noise emanating from the electronics rack. Again, one or more heat exchangers fins 1235 are also provided to enhance structural rigidity of the noise-reducing attachment apparatus.

Those skilled in the art will note from the above description that provided herein are various embodiments of a noise-reducing attachment apparatus which may be readily mounted to and removed from a heat exchanger door. The noise-reducing attachment apparatus is configured to attenuate noise emanating from an electronics rack through the heat exchanger door, while minimizing airflow impedance through the noise-reducing attachment apparatus. Various configurations are provided to maximize the surfaces and blockages within the noise-reducing attachment apparatus in the noise path from noise sources within the electronics rack. Thus, noise energy which would otherwise be free to pass directly through the heat exchanger door into the data center is attenuated and force to impinge on acoustically absorptive material where it will be partially absorbed. Outer shell structures of the noise-reducing attachment apparatuses further reflect noise energy back into the heat exchanger door, and hence, into the electronics rack, thereby further reducing noise levels within the data center. The various shapes and angles of the noise-reducing attachment apparatuses, and the interior sections thereof, are designed to maximize the acoustical absorption of the apparatus, while at the same time minimizing any added pressure drop and flow impedance through the noise-reducing attachment apparatus.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A noise-reducing attachment apparatus comprising:
    a frame structure designed to physically attach, and comprising an attachment mechanism to physically attach, to an exterior of a heat exchanger door hingedly mounted to an electronics rack, the frame structure comprising a width that is less than a width of the heat exchanger door, and the heat exchanger door comprising an air opening and an air-to-liquid heat exchanger, wherein air passing through the air opening also passes across the air-to-liquid heat exchanger, the air opening in the heat exchanger door facilitating the ingress or egress of external air through the electronics rack, and wherein the frame structure defines in part at least one airflow channel through the noise-reducing attachment apparatus, and wherein the frame structure is sized to overlie the air opening in the heat exchanger door and air passing through the air opening passes through the at least one airflow channel when the noise-reducing attachment apparatus is operatively attached via the attachment mechanism to the heat exchanger door; and
    an acoustically absorptive material coupled to the frame structure and at least partially defining the at least one airflow channel through the noise-reducing attachment apparatus, the acoustically absorptive material being selected and positioned to attenuate noise emanating from the electronics rack through the air opening in the heat exchanger door when the noise-reducing attachment apparatus is operatively coupled to the heat exchanger door.

2. The noise-reducing attachment apparatus of claim 1, wherein the at least one airflow channel through the noise-reducing attachment apparatus redirects air passing through the air opening of the heat exchanger door when the noise-reducing attachment apparatus is operatively coupled to the heat exchanger door, and wherein the attachment mechanism comprises an upper tongue and lower tongue, the upper tongue being configured to reside within a first slot at a top of the heat exchanger door and the lower tongue being configured to reside within a second slot at a bottom of the heat exchanger door when the noise-reducing attachment apparatus is operatively attached to the heat exchanger door.

3. The noise-reducing attachment apparatus of claim 1, wherein the frame structure further comprises at least one interior surface facing the heat exchanger door when the noise-reducing attachment apparatus is operatively coupled thereto, and wherein the acoustically absorptive material is coupled to the at least one interior surface of the frame structure for facilitating attenuation of noise emanating from the electronics rack.

4. The noise-reducing attachment apparatus of claim 1, wherein the frame structure and the acoustically absorptive material are configured and selected, respectively, to balance noise attenuation of the noise-reducing attachment apparatus with pressure drop of air passing through the at least one airflow channel thereof, wherein the frame structure and the acoustically absorptive material are tailored, in part, based on air-flow impedance across the air-to-liquid heat exchanger of the heat exchanger door hingedly mounted to the electronics rack.

5. The noise-reducing attachment apparatus of claim 1, wherein the frame structure is configured to bifurcate air passing through the air opening in the heat exchanger door to pass through one of a first airflow channel or a second airflow channel, and wherein the frame structure further comprises a centrally disposed wedge-shaped structure which facilitates, in part, passage of air through the noise-reducing attachment apparatus via the first airflow channel or the second airflow channel, and wherein the acoustically absorptive material is coupled to interior surfaces of the frame structure in part defining the first airflow channel and the second airflow channel, the centrally disposed wedge-shaped structure being oriented to point towards the air opening in the heat exchanger door when the noise-reducing attachment apparatus is operatively coupled to the heat exchanger door.

6. The noise-reducing attachment apparatus of claim 5, wherein the centrally disposed wedge-shaped structure of the frame structure comprises a wedge-shaped fin structure comprising a wedge shape defined by the acoustically absorption material, wherein the multiple surfaces of the wedge-shaped fin structure and the acoustically absorptive material of the wedge-shaped fin structure face the air opening in the heat exchanger door when the noise-reducing attachment apparatus is operatively coupled to the heat exchanger door.

7. The noise-reducing attachment apparatus of claim 1, wherein the frame structure is an elongate structure which defines a plurality of airflow channels through the noise-reducing attachment apparatus, and wherein the acoustically absorptive material is coupled to interior surfaces of the frame structure facing the heat exchanger door when the noise-reducing attachment apparatus is operatively coupled thereto, and wherein the frame structure comprises at least one horizontal fin intermediate its upper and lower ends, the at least one horizontal fin dividing the plurality of airflow channels into a plurality of airflow subchannels.

8. The noise-reducing attachment apparatus of claim 1, wherein the frame structure comprises an outer shell facing and spaced from the heat exchanger door when the noise-reducing attachment apparatus is operatively coupled thereto, and the acoustically absorptive material is coupled to an interior surface of the outer shell, and wherein the at least one airflow channel of the noise-reducing attachment apparatus redirects air passing through the air opening of the heat exchanger door through at least one side opening only in the noise-reducing attachment apparatus.

9. The noise-reducing attachment apparatus of claim 8, wherein the frame structure further comprises a centrally disposed structure which facilitates bifurcating of air passing through the air opening of the heat exchanger door, and wherein the noise-reducing attachment apparatus comprises at least two side openings, including first and second side openings in opposing sides of the noise-reducing attachment apparatus, which allow for one of the ingress or egress of air through the noise-reducing attachment apparatus, and hence, through the air opening in the heat exchanger door when the noise-reducing attachment apparatus is operatively coupled thereto.

10. The noise-reducing attachment apparatus of claim 8, wherein the at least one opening is in one side only of the noise-reducing attachment apparatus, wherein air enters or exits through the noise-reducing attachment apparatus via the at least one airflow opening in the one side thereof, and wherein a direction of airflow through the at least one opening is orthogonal to a direction of airflow through the air opening in the heat exchanger door when the noise-reducing attachment apparatus is operatively coupled thereto.

11. A heat exchanger door assembly for an electronics rack comprising:
  a heat exchanger door, the heat exchanger door comprising:
    a door frame configured to hingedly mount to the electronics rack at one of an air inlet side or air outlet side thereof, the air inlet and air outlet sides respectively enabling ingress and egress of external air through the electronics rack, the door frame comprising an air opening facilitating the ingress or egress of external air through the electronics rack;
    an air-to-liquid heat exchanger supported by the door frame, wherein air passing through the electronics rack from the air inlet side to the air outlet side thereof passes across the air-to-liquid heat exchanger when the heat exchanger door is operatively hingedly mounted to the electronics rack and through the air opening in the door frame; and
  a noise-reducing attachment apparatus coupled to the heat exchanger door, the noise-reducing attachment apparatus comprising:
    a frame structure comprising an attachment mechanism coupling the frame structure to an exterior of the heat exchanger door, the frame structure defining in part at least one airflow channel through the noise-reducing attachment apparatus, and comprising a width that is less than a width of the heat exchanger, wherein the frame structure is sized to overlie the air opening in the heat exchanger door, and air passing through the air opening in the heat exchanger door passes through the at least one airflow channel of the frame structure; and
    an acoustically absorptive material coupled to the frame structure and at least partially defining the at least one airflow channel through the noise-reducing attachment apparatus, the acoustically absorptive material being selected and positioned to attenuate noise emanating from the electronics rack through the air opening in the heat exchanger door when the heat exchanger door assembly is operatively mounted thereto.

12. The heat exchanger door assembly of claim 11, wherein the at least one airflow channel through the noise-reducing attachment apparatus redirects air passing through the air opening of the door frame, and wherein the frame structure further comprises at least of one interior surface facing the heat exchanger door, the acoustically absorptive material being coupled to the at least one interior surface of the frame structure for facilitating attenuation of noise emanating from the electronics rack, and wherein the attachment mechanism comprises an upper tongue and a lower tongue, the upper tongue being coupled to a first slot at a top of the heat exchanger door and the lower tongue being coupled to a second slot at a bottom of the heat exchanger door.

13. The heat exchanger door assembly of claim 11, wherein multiple characteristics of the heat exchanger door and the noise-reducing attachment apparatus are configured to balance airflow impedance through the heat exchanger door assembly with noise attenuation of the noise-reducing attachment apparatus, and wherein the electronics rack comprising at least one existing air moving device for moving air from the air inlet side to the air outlet side thereof, and wherein airflow impedance through the heat exchanger door assembly is controlled so that inlet-to-outlet air flows through the heat exchanger door assembly when mounted to the electronics rack without requiring an additional air moving device other than the at least one existing air moving device of the electronics rack, wherein the frame structure and the acoustically absorptive material are tailored, in part, based on air-flow impedance across the air-to-liquid heat exchanger of the heat exchanger door.

14. The heat exchanger door assembly of claim 13, wherein configuring the multiple characteristics to balance airflow impedance through the heat exchanger door assembly with noise attenuation of the noise-reducing attachment apparatus restricts the amount of noise attenuated by the noise-reducing attachment apparatus.

15. The heat exchanger door assembly of claim 11, wherein the frame structure is configured to bifurcate air passing through the air opening in the heat exchanger door to pass through one of a first airflow channel or a second airflow channel, and wherein the frame structure further comprises a centrally disposed wedge-shaped structure which facilitates, in part, passage of air through the noise-reducing attachment apparatus via the first air flow channel or the second air flow channel, and wherein the acoustically absorptive material is coupled to interior surfaces of the frame structure in part defining the first airflow channel and the second airflow channel, the centrally disposed wedge-shaped structure being oriented to point towards the air opening in the heat exchanger door.

16. The heat exchanger door assembly of claim 11, wherein the frame structure comprises an outer shell facing and spaced from the heat exchanger door, and the acoustically absorptive material is coupled to an interior surface of the outer shell, and wherein the at least one airflow channel of the noise-reducing attachment apparatus redirects air passing through the air opening in the door frame through at least one side opening only in the noise-reducing attachment apparatus.

17. The heat exchanger door assembly of claim 16, wherein the frame structure further comprises a centrally disposed structure which facilitates bifurcating of air passing through the air opening of the door frame, and wherein the noise-reducing attachment apparatus comprising at least two side openings, including first and second side openings in opposing sides of the noise-reducing attachment apparatus, which allow for one of the ingress or egress of air through the noise-reducing attachment apparatus, and hence, through the air opening in the door frame.

18. A cooled electronics system comprising:
an electronics rack, the electronics rack including:
an air inlet side and an air outlet side, the air inlet and outlet sides respectively enabling ingress and egress of external air;
at least one air moving device, the at least one air moving device being capable of causing external air to flow from the air inlet side of the electronics rack to the air outlet side of the electronics rack;
a heat exchanger door, the heat exchanger door comprising:
a door frame configured to hingedly mount to the electronics rack at one of the air inlet side or air outlet side thereof, the door frame comprising air opening facilitating the ingress or egress of external air through the electronics rack;
an air-to-liquid heat exchanger supported by the door frame, wherein air passing through the electronics rack from the air inlet side to the air outlet side thereof passes across the air-to-liquid heat exchanger;
a noise-reducing attachment apparatus coupled to the heat exchanger door, the noise-reducing attachment apparatus comprising:
a frame structure comprising an attachment mechanism coupling the frame structure to an exterior of the heat exchanger door, the frame structure defining in part at least one airflow channel through the noise-reducing attachment apparatus, and comprising a width that is less than a width of the heat exchanger, wherein the frame structure is sized to overlie the air opening in the heat exchanger door, and air passing through the air opening in the heat exchanger door passes through the at least one airflow channel of the frame structure;
an acoustically absorptive material coupled to the frame structure and at least partially defining the at least one airflow channel through the noise-reducing attachment apparatus, the acoustically absorptive material being selected and positioned to attenuate noise emanating from the electronics rack through the air opening in the heat exchanger door.

19. The cooled electronics system of claim 18, wherein the at least one airflow channel through the noise-reducing attachment apparatus redirects at least a portion of air passing through the air opening of the door frame, and wherein the frame structure of the noise-reducing attachment apparatus further comprises at least one interior surface facing the heat exchanger door, the acoustically absorptive material being coupled to the at least one interior surface of the frame structure for facilitating attenuation of noise emanating from the electronics rack, wherein the frame structure and the acoustically absorptive material are configured and selected, respectively, to balance noise attenuation of the noise-reducing attachment apparatus with pressure drop of air passing through the at least one air flow channel defined by the frame structure, and wherein the frame structure and the acoustically absorptive material are also tailored, in part, based on air flow impedance across the air-to-liquid heat exchanger of the heat exchanger door.

20. The cooled electronics system of claim 18, wherein the frame structure is configured to bifurcate air passing through the air opening of the heat exchanger door for passing through one of a first airflow channel or a second airflow channel, and the frame structure further comprises a centrally disposed wedge-shaped structure which facilitates, in part, passage of air through the noise-reducing attachment apparatus via the first airflow channel or the second airflow channel, and wherein the acoustically absorptive material is coupled to interior surfaces of the frame structure defining the first airflow channel and the second airflow channel, the centrally disposed wedge-shaped structure being oriented to point towards the air opening in the heat exchanger door.

* * * * *